United States Patent [19]
Kwak

[11] Patent Number: 5,848,016
[45] Date of Patent: Dec. 8, 1998

[54] MERGED MEMORY AND LOGIC (MML) INTEGRATED CIRCUITS AND METHODS INCLUDING SERIAL DATA PATH COMPARING

[75] Inventor: Jin-seok Kwak, Kyungki-do, Rep. of Korea

[73] Assignee: Samsung Electronics Co., Ltd., Suwon, Rep. of Korea

[21] Appl. No.: 1,866

[22] Filed: Dec. 31, 1997

[30] Foreign Application Priority Data

May 8, 1997 [KR] Rep. of Korea ............... 97037351

[51] Int. Cl.⁶ ............................................. G11C 7/00
[52] U.S. Cl. .............. 365/201; 365/189.02; 365/189.07
[58] Field of Search ............................ 365/201, 189.02, 365/189.07, 230.02

[56] References Cited

U.S. PATENT DOCUMENTS

| | | | |
|---|---|---|---|
| 5,164,918 | 11/1992 | Ogino et al. | 365/201 |
| 5,400,281 | 3/1995 | Morigami | 365/201 |
| 5,430,677 | 7/1995 | Fandrich et al. | 365/189.02 |
| 5,483,493 | 1/1996 | Shin | 365/201 |

*Primary Examiner*—David Nelms
*Assistant Examiner*—Son Mai
*Attorney, Agent, or Firm*—Myers Bigel Sibley & Sajovec

[57] ABSTRACT

An integrated circuit having a wide internal data path, such as a Merged Memory and Logic (MML) integrated circuit, is tested by serially comparing data on one of the data paths to data on selected others of the data paths. A first indication is provided if the serially compared data on the one of the data paths and on the selected others of the data paths are all a first logic value. A second indication is provided if the serially compared data on the one of the data paths and on the selected others of the data paths are all a second logic value. A third indication is provided if the serially compared data on the one of the data paths and on the selected others of the data paths are of differing logic values. By serially comparing data on one of the data paths to data on selected others of the data paths, a reduced number of comparators may be provided. Efficient circuits and methods for testing integrated circuits, such as memory integrated circuits or logic integrated circuits, may thereby be provided.

27 Claims, 4 Drawing Sheets

MERGED MEMORY AND LOGIC (MML) INTEGRATED CIRCUITS AND METHODS INCLUDING SERIAL DATA PATH COMPARING

FIELD OF THE INVENTION

This invention relates to integrated circuit devices, and more particularly to testing of integrated circuit devices.

BACKGROUND OF THE INVENTION

Integrated circuit devices, such as integrated circuit memory devices and integrated circuit logic devices, are widely used in consumer and commercial applications. As the integration densities of these integrated circuits continue to increase, the number of internal data paths in the integrated circuit also generally continues to increase. The data path width also generally reflects the number of data input/output channels, referred to as "DQ" channels.

In simple integrated circuits, "x1" products having one-DQ were used. These were followed by "x4" and "x8" products having four and eight bit wide data paths, respectively. In the current state of the art, byte-wide "x16" products are also widely used. In the future, the number of DQ channels may be expected to increase further.

Recently, Merged Memory and Logic (MML) integrated circuits have been developed. MML integrated circuits generally include a large capacity memory and a large logic block that are merged in one integrated circuit. Thus, an MML integrated circuit can replace discrete memory and logic chips that are used in personal computers and other consumer and commercial devices.

In an MML integrated circuit, in order to provide effective communications between the large memory block and the large logic block, a large number of internal data paths may be provided. For example, 256 or more internal data paths may be provided.

The large number of data paths that are used in state-of-the-art integrated circuits may present a problem during testing of the integrated circuits. For example, in testing, multiple integrated circuits are often tested by test equipment simultaneously. The test equipment generally includes a fixed number of DQ channels and test pins, for reading data from and writing data into integrated circuit devices that are being tested. Thus, when the integrated circuit memory device has a large data path width, the number of integrated circuit devices that can be tested simultaneously may be reduced.

In order to increase the number of integrated circuit devices that can be tested simultaneously, a reduced DQ scheme can be used in which an integrated circuit device can be tested using a reduced data path width. For example, an x16 device can be tested in an x4 mode. Alternatively, a Merged DQ (MDQ) technique can be used in which several internal DQs are merged onto one input/output pad.

A conventional MDQ technique will now be described. In one important test of a memory device, a first logic value such as ZERO is written into all of the memory cells. All of the memory cells are then read to determine that all ZEROs were stored. Then, a second logic value such as ONE is written into all the memory cells and read from the memory cells to determine that ONE was stored. High density integrated circuit memory devices and MML devices often provide built-in testing circuits. Thus, comparators may be provided in the integrated circuit to compare data read from the memory cells in order to determine whether all ONEs or all ZEROs were properly written and read. Then, an indication may be provided on a single input/output pad as to whether all ZEROs were properly written and read and all ONEs were properly written and read. Thus, an MDQ technique is provided.

In order to provide this built-in test circuitry, multiple comparators are used to compare the data on the data paths in the integrated circuit. The multiple comparators can thus merge the data on multiple data paths into a single output, for the MDQ technique.

FIG. 1 shows a conventional MDQ circuit that merges four internal data paths Dout0 . . . Dout3 into one representative DQ pad 111. As shown, the circuit includes a parity generator comprising a NOR gate 101, an AND gate 103 and an OR gate 105. The NOR gate 101, AND gate 103 and OR gate 105 form a comparator that compares the values on each of the internal DQs Dout0–Dout3. The comparator drives an AND gate 107 and input/output buffer 109.

Unfortunately, as the number of internal data paths increase, the number of comparators may also increase prohibitively. For example, in an MML integrated circuit, which can include up to 256 or more internal data paths and up to 8 or more external data paths, up to 32 or more internal data paths may be merged into each output DQ pad. Thus, up to 32 or more internal DQs are compared with one another. This may use 31 one-bit comparators for each group of 32 internal DQs. Thus, up to 248 or more one-bit comparators may be used in the MML integrated circuit. The area and complexity of this MDQ circuit may therefore become prohibitively large.

SUMMARY OF THE INVENTION

It is therefore an object of the present invention to provide improved comparing circuits and methods for integrated circuits.

It is another object of the present invention to provide efficient comparing circuits and methods for integrated circuits having wide data paths.

It is yet another object of the present invention to provide efficient comparing circuits and methods for Merged Memory and Logic (MML) integrated circuits.

These and other objects are provided, according to the present invention, by serially comparing data on one of the data paths to data on selected others of the data paths. A first indication is provided if the serially compared data on the one of the data paths and on the selected others of the data paths are all a first logic value. A second indication is provided if the serially compared data on the one of the data paths and on the selected others of the data paths are all a second logic value. A third indication is provided if the serially compared data on the one of the data paths and on the selected others of the data paths are of differing logic values. By serially comparing data on one of the data paths to data on selected others of the data paths, a reduced number of comparators may be provided. Efficient circuits and methods for testing integrated circuits, such as memory integrated circuits or logic integrated circuits, may thereby be provided.

The present invention is particularly useful with merged memory and logic (MML) integrated circuits that include a memory block, a logic block and a plurality of data paths that interconnect the memory block and the logic block. A serial comparing circuit is provided in the MML integrated circuit. The serial comparing circuit serially compares data on one of the data paths to data on selected others of the data paths, to provide a first indication if the serially compared data on one of the data paths and the selected others of the data paths are all a first logic value, to provide a second indication if the serially compared data on the one of the data paths and on the selected others of the data paths are all of a second logic value, and to provide a third indication if the serially compared data on the one of the data paths and on the selected others of the data paths are of differing logic values. A data output pad may also be provided that is responsive to the serial comparing circuit, to provide the first, second and third indications external to the MML integrated circuit. Preferably, the first indication is the first logic value, the second indication is the second logic value and the third indication is a high impedance state.

The serial comparing circuit may be implemented using a single comparator. A first register stores therein the data on the one of the data paths. A multiplexer serially outputs the data on the selected others of the data paths. A comparator is responsive to the first register and to the multiplexer, to serially compare the data on the one of the data paths that is stored in the first register and the serially output data on the selected others of the data paths from the multiplexer, and produce a fourth indication when the compared data is identical and a fifth indication when the compared data is different.

A second register may also be provided that is responsive to the comparator. The second register stores therein a sixth indication if the comparator ever produces the fifth indication when serially comparing the data on one of the data paths to the serially output data on the selected others of the data paths. The second register stores therein a seventh indication if the comparator never produces the fifth indication when serially comparing the data on the one of the data paths to the serially output data on the selected others of the data paths.

A buffer may also be provided, that is responsive to the first register and to the second register, to produce the first indication at a data output pad if the first register stores data of the first logic value and the second register stores the seventh indication. The buffer produces the second indication at the data output pad if the first register stores data of the second logic value and the second register stores the seventh indication. The buffer produces the third indication at the data output pad if the second register stores the sixth indication. The buffer is preferably a tri-state buffer and the third indication preferably is a high impedance state. The second register may include an input and an output. A combining circuit is connected to the input, that is responsive to the comparator and to the output, to logically combine the fourth indication, the fifth indication and the output.

Accordingly, MML integrated circuits may be tested by serially comparing, in the MML integrated circuit, data on one of the data paths to data on selected others of the data paths, to provide a first indication if the serially compared data on the one of the data paths and on the selected others of the data paths are all a first logic value, to provide a second indication if the serially compared data on the one of the data paths and on the selected others of the data paths are all a second logic value, and to provide a third indication if the serially compared data on the one of the data paths and on the selected others of the data paths are of different logic values. The first, second and third indications are preferably provided external to the MML integrated circuit.

The serial comparing step preferably comprises the steps of storing the data on the one of the data paths, serially outputting the data on the selected others of the data paths and serially comparing the stored data on the one of the data paths and the serially output data on the selected others of the data paths, to produce a fourth indication when the compared data is identical and a fifth indication when the compared data is different. A sixth indication is stored if the serially comparing step ever produces the fifth indication when serially comparing the data on the one of the data paths and the serially output data on the selected others of the data paths. A seventh indication is stored if the serially comparing step never produces the fifth indication when serially comparing the data on the one of the data paths and the serially output data on the selected others of the data paths.

The first indication may be produced in response to the seventh indication if the data on the one of the data paths is of the first logic value. The second indication may be produced in response to the seventh indication if the data on the one of the data paths is of the second logic value. The third indication may be produced in response to the sixth indication. The fourth indication, the sixth indication and the seventh indication may be logically combined. The first indication preferably is the first logic value, the second indication is preferably the second logic value and the third indication is preferably a high impedance state.

Accordingly, by serially comparing the data on one of the internal data paths with the data on the other data paths and provide an indication as to whether all ONEs, all ZEROs or different values are present, efficient testing of integrated circuits having wide data paths may be provided. The number of comparators may be reduced to reduce the area occupied by the on-chip testing circuits. Moreover, the number of external data paths may be greatly reduced so that many integrated circuits may be tested simultaneously.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
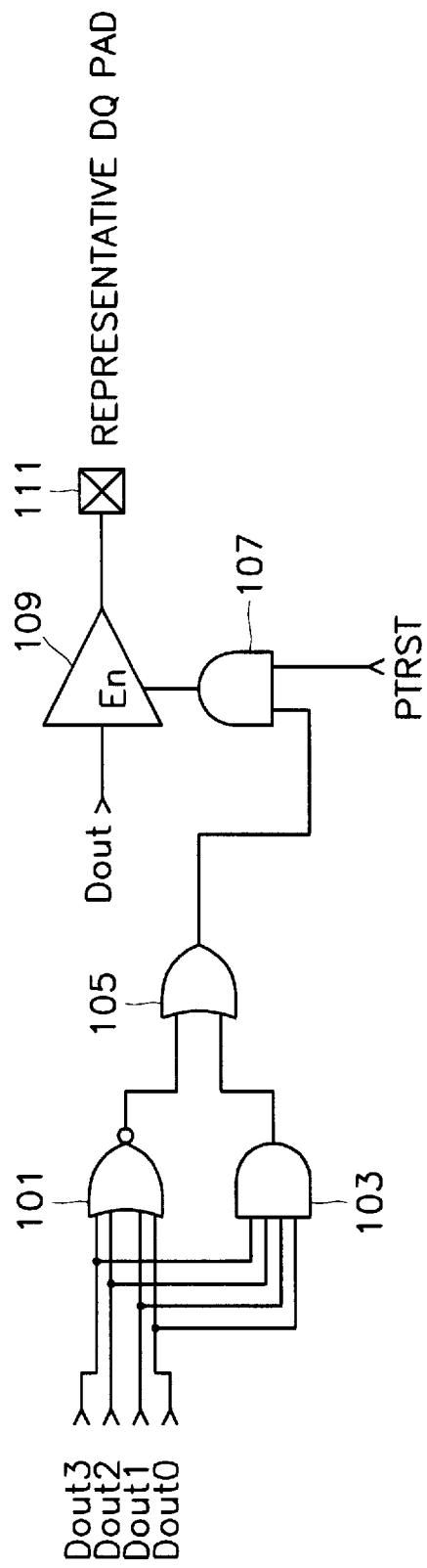
FIG. 1 is a circuit diagram of a conventional merged data path circuit.
Figure 2:
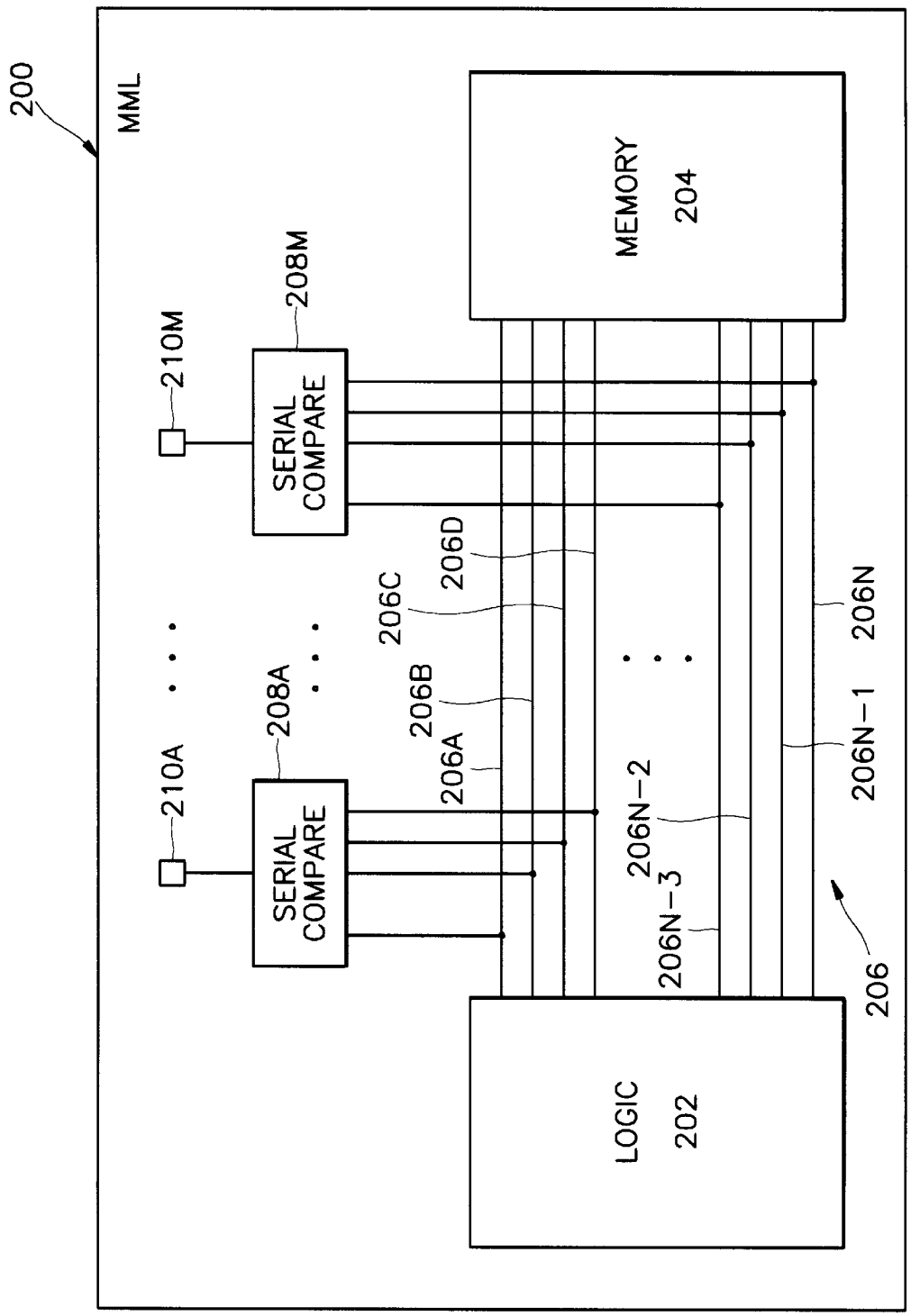
FIG. 2 is a block diagram of merged memory and logic integrated circuits including serial comparing circuits and methods according to the present invention.

Referring now to FIG. 2, a block diagram of an MML integrated circuit according to the present invention is shown. As shown in FIG. 2, MML integrated circuit 200 includes a memory block 204 and a logic block 202. A plurality of data paths 206A–206N interconnect the memory block and the logic block. One or more serially comparing circuits 208A–208M serially compares data on one of the data paths to data on selected others of the data paths.

For example, as shown in FIG. 2, serial comparing circuit 208A serially compares data on data path 206A to data on data paths 206B–206D. As also shown, serial comparing circuit 208M serially compares data on one of the data paths 206N-3 to the data on the other data paths 206N-2–206N. The serial comparing circuit 208A–208M provides a first indication on an associated data output pad 210A–210M if the serially compared data is all a first logic value, a second indication of the serially compared data is all a second logic value and a third indication if the serially compared data is of differing logic values. Preferably, if all of the serially compared data is a ONE, then a ONE is output at the data output pad 210 and if all of the serially compared data is ZERO, then a ZERO is output. If the serially compared data is different, then a high impedance state may be output at the corresponding data output pad 210.

It will be understood by those having skill in the art that one or more serially comparing circuits may be provided in an integrated circuit chip. If one serially comparing circuit is provided, it may compare data on one of the data paths to data on all of the remaining data paths. Alternatively, if multiple serial compare circuits are provided, each may compare data on one data path to data on selected others of the data paths. Moreover, it will also be understood that a multibit indication may be provided on one or more data pads rather than on a single bit and a high impedance state.

Figure 3:
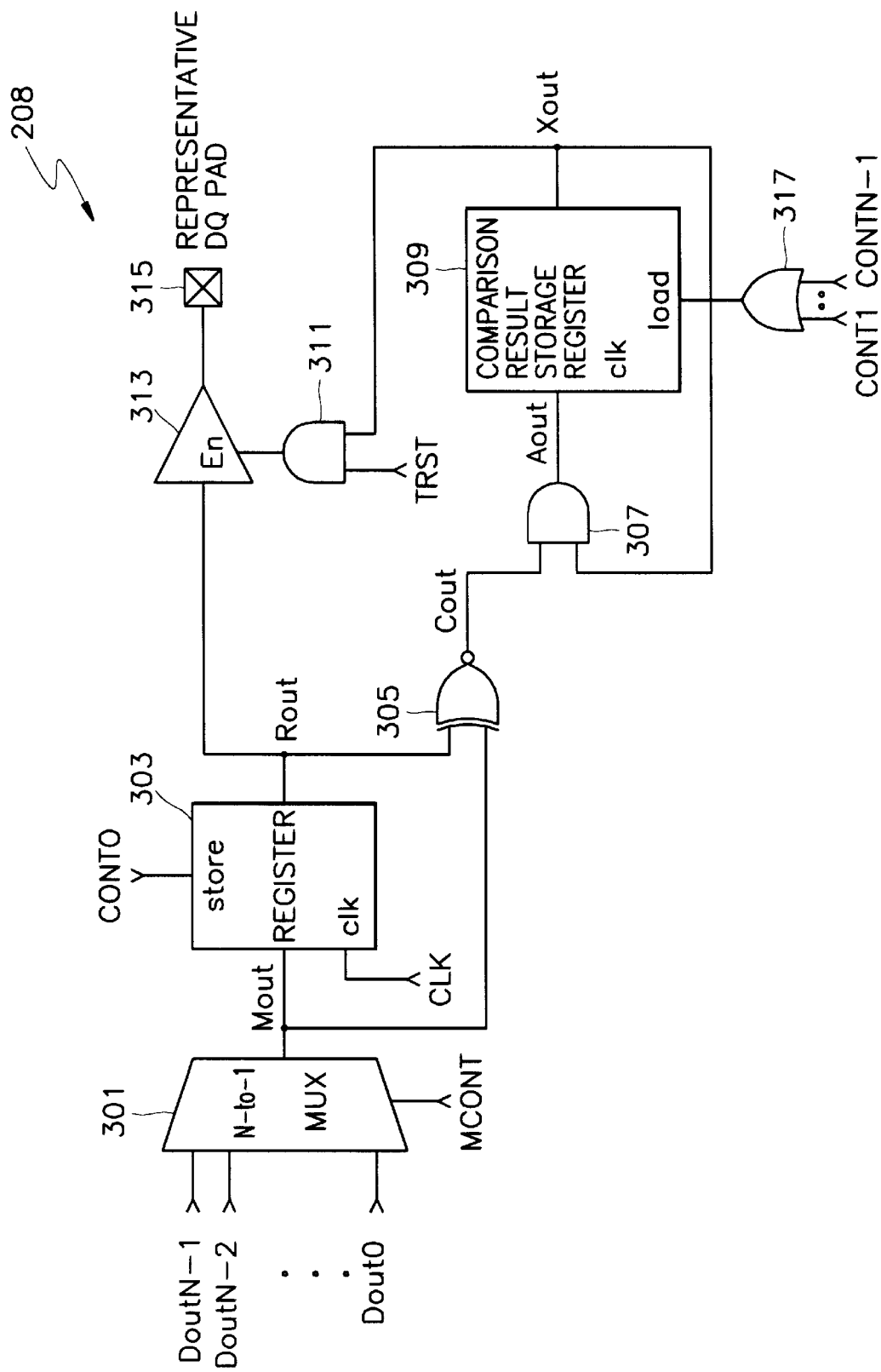
FIG. 3 is a circuit diagram of a serially comparing circuit of FIG. 2.

Referring now to FIG. 3, a block diagram of a serial comparing circuit 208 of FIG. 2 will now be provided. The circuit of FIG. 3 operates to merge N output data paths that are output from a memory block to a single representative DQ pad.

In particular, referring to FIG. 3, a multiplexer 301 sequentially selects the output data from the N data output paths Dout0 . . . DoutN–1, corresponding to data paths 206A . . . 206N of FIG. 2, and outputs the sequentially selected output data that is read from the memory block as output signals Mout in response to a selection control signal MCONT. The selection control signal MCONT may be produced by decoding an address that is directly input from a counter within the integrated circuit device, or from a pad, and generally has a plurality of bits. The selection control signal MCONT is preferably incremented once for every clock cycle of clock CLK.

First register 303 is a one-bit register that is controlled by a control signal CONT0 and stores therein the data on the one of the data paths, i.e., the first output data Dout0 that is output from the multiplexer 301, to generate an output signal Rout. Preferably, first output data Dout0, that is stored in the first register 303, is output external of the integrated circuit through the representative DQ pad 315, when the N output data Dout0 through DoutN–1 are all the same, that is when the merge result is true. Thus, the output signal Rout provides a first indication when all the output data is a first logic value and a second indication when all the output data is a second logic value. Preferably, the first indication is the first logic value and the second indication is the second logic value.

Still continuing with the description of FIG. 3, comparator 305 comprising an EXCLUSIVE NOR gate, responsive to the first register 303 and to the multiplexer 301, serially compares the data on the one of the data paths restored in the first register 303 and the serially output data Dout1–DoutN–1 on the selected others of the data paths from the multiplexer. The output Cout of comparator 305 provides a fourth indication when the compared data is identical and a fifth indication when the compared data is different. For example, a ONE may be produced if the compared data is identical, and a ZERO may be produced if the compared data is different.

The fourth and fifth indications are provided by the value of Cout that is output from the comparator 305. A second register 309, also referred to as a comparison result storage register, is also provided. The second register 309 is responsive to the comparator 305, to produce a signal Xout which provides a sixth indication if the comparator 305 ever produces the fifth indication when serially comparing the data, and a seventh indication if the comparator never produces the fifth indication when serially comparing the data. For example, the signal Xout may be ONE if the comparator ever indicates a mismatch, and ZERO otherwise.

More specifically, the second register 309 stores the result Aout of ANDing the output Cout of comparator 305 and the output Xout of the second register 309. AND gate 307 provides the AND function. Control signals CONT1–CONT-1 are provided to the load terminal of the second register 309 via OR gate 317. AND gate 307 provides an AND operation of the output signal Cout of the one-bit comparator 305 and the output signal Xout of the second register itself. Initially, second register 309 is initialized to a logic ONE output.

Still referring to FIG. 3, the serial comparing circuit 208 also includes a representative DQ pad 315 and a buffer 313. The buffer is responsive to the output Rout of the first register 303 and the output Xout of the second register 309, to produce the first indication at the data output pad 315, if the first register stores data of the first logic value and the second register stores the seventh indication. Thus, preferably if all of the data paths DoutN–1 through Dout0 all contain the ONE, then a ONE is output at DQ pad 315. Conversely, if all of the data on data paths DoutN–1 through Dout0 are ZERO, then a ZERO will be output at DQ pad 315. A third indication, such as a high impedance state, is produced at the representative DQ pad 315 if the second register 309 stores the sixth indication, that indicates that the data on the plurality of data paths was not all the same value.

More specifically, the buffer 313 outputs the output signal Rout of the first register 303 to the representative DQ pad 315 in response to a signal that is produced by ANDing a control signal TRST and the output signal OUT of the second register 309 using AND gate 311. The control signal TRST is activated after the last comparison result of the one-bit comparator 305 is output to the second register 309.

Figure 4:
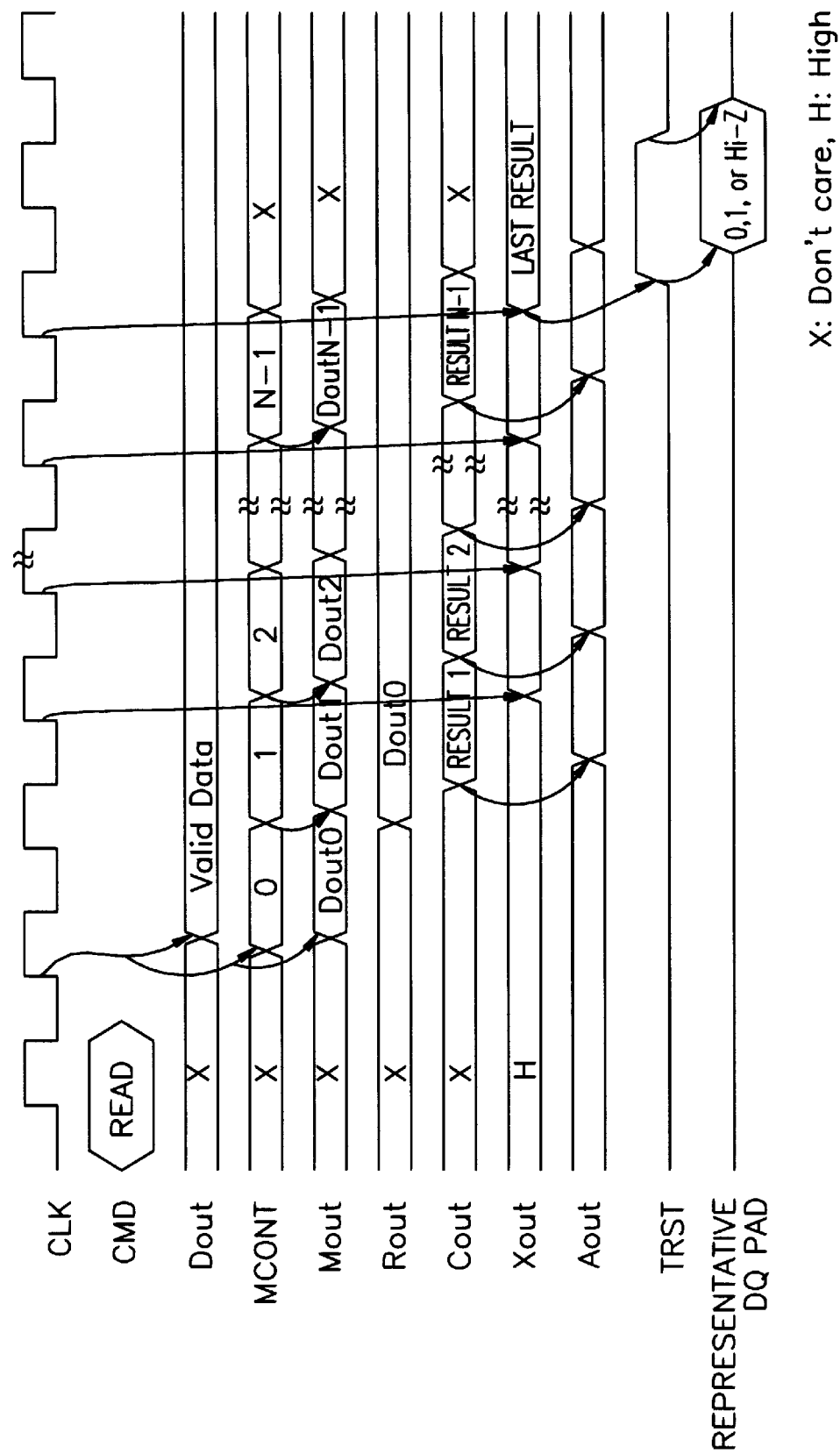
FIG. 4 is a timing diagram for the circuit of FIG. 3.

FIG. 4 is a timing diagram for the serial comparing circuit of FIG. 3. The timing diagram assumes that the memory block 204 of the MML integrated circuit 200 is a synchronous DRAM, having burst length of 1 and a CAS latency of 2.

Referring now to FIG. 4, if a read command READ is applied to the integrated circuit, output data Dout0 through DoutN—1 are output from a predetermined memory block. The output data Dout is maintained until data is changed by newly applied read command READ. The multiplexer 301 receives the output data Dout0 through DoutN–1 sequentially selects the same in response to the selection control signal MCONT incrementing once for each cycle of the clock CLK, and outputs the output signal Mout.

The first output data Dout0 of the multiplexer 301 is stored in the first register 303, and is output as the output signal Rout. The second through last output data Dout1 through DoutN–1 and the first output data Dout0 stored in the first register 303 are serially compared by the one bit comparator 305, and the comparison results 1 through N–1 are output as the control signal Cout. Thus, a fourth indication is produced when the compared data is identical and a fifth indication is produced when the compared data is different.

The output signal Cout of comparator 305, and the output signal Xout of the second register 309 are ANDed by AND gate 307. The result is stored in the second register 309. Therefore, the last comparison result N−1 of the one-bit comparator 305 is finally stored in the second register 309. The control signal TRST is activated after the last comparison result of the comparator 305 is output to the second register 309.

If the N output data Dout0 through DoutN−1 are all the same, the last output signal Xout of the comparison result storage register 309 is high, to provide a seventh indication. Accordingly, the signal produced by the AND operation of AND gate 311 is activated so that the output Rout of the one-bit register 303 is output external to the integrated circuit through the representative DQ pad 315. Conversely, if there is any different data during the comparisons of the output data paths Dout0 through DoutN−1, the output of signal Xout of the comparison result storage register 309 is low, to provide a sixth indication. The signal produced by the AND operation of the AND gate 311 is not activated so that the input/output buffer 313 is disabled and thus the representative DQ pad 315 is in a high impedance state.

Accordingly, the present invention serially compares output data on a plurality of data pads so that a single comparator can be used for each representative DQ pad. The number of comparators can thereby be reduced. The area occupied by built-in test circuits can therefore be reduced in integrated circuits having wide data paths. Moreover, since a single DQ pad can be provided for many data paths, large numbers of devices may be tested in parallel using common test equipment.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A merged memory and logic (MML) integrated circuit comprising:

a memory block;

a logic block;

a plurality of data paths that interconnect the memory block and the logic block; and a serial comparing circuit that serially compares data on one of the data paths to data on selected others of the data paths, to provide a first indication if the serially compared data on the one of the data paths and on the selected others of the data paths are all a first logic value, to provide a second indication if the serially compared data on the one of the data paths and on the selected others of the data paths are all a second logic value, and to provide a third indication if the serially compared data on the one of the data paths and on the selected others of the data paths are of differing logic values.

2. An MML integrated circuit according to claim 1 further comprising:

a data output pad that is responsive to the serial comparing circuit, to provide the first, second and third indications external to the MML integrated circuit.

3. An MML integrated circuit according to claim 1 wherein the serial comparing circuit comprises:

a first register that stores therein the data on the one of the data paths;

a multiplexer that serially outputs the data on the selected others of the data paths; and a comparator that is responsive to the first register and the multiplexer, to serially compare the data on the one of the data paths that is stored in the first register and the serially output data on the selected others of the data paths from the multiplexer, and produce a fourth indication when the compared data is identical and a fifth indication when the compared data is different.

4. An MML integrated circuit according to claim 3 wherein the serial comparing circuit further comprises:

a second register that is responsive to the comparator to store therein a sixth indication if the comparator ever produces the fifth indication when serially comparing the data on the one of the data paths and the serially output data on the selected others of the data paths, and to store therein a seventh indication if the comparator never produces the fifth indication when serially comparing the data on the one of the data paths and the serially output data on the selected others of the data paths.

5. An MML integrated circuit according to claim 4 wherein the serial comparing circuit further comprises:

a data output pad; and a buffer that is responsive to the first register and to the second register, to produce the first indication at the data output pad if the first register stores data of the first logic value and the second register stores the seventh indication, to produce the second indication at the data output pad if the first register stores data of the second logic value and the second register stores the seventh indication, and to produce the third indication at the data output pad if the second register stores the sixth indication.

6. An MML integrated circuit according to claim 4 wherein the second register includes an input and an output, the MML integrated circuit further comprising:

a combining circuit connected to the input, and that is responsive to the comparator and to the output, to logically combine the fourth indication, the fifth indication and the output.

7. An MML integrated circuit according to claim 5 wherein the buffer is a tri-state buffer and wherein the third indication is a high impedance state.

8. An MML integrated circuit according to claim 1 wherein the first indication is the first logic value, wherein the second indication is the second logic value, and wherein the third indication is a high impedance state.

9. A merged memory and logic (MML) integrated circuit comprising:

memory means;

logic means;

a plurality of data paths that interconnect the memory means and the logic means; and means for serially comparing data on one of the data paths to data on selected others of the data paths, to provide a first indication if the serially compared data on the one of the data paths and on the selected others of the data paths are all a first logic value, to provide a second indication if the serially compared data on the one of the data paths and on the selected others of the data paths are all a second logic value, and to provide a third indication if the serially compared data on the one of the data paths and on the selected others of the data paths are of differing logic values.

10. An MML integrated circuit according to claim 9 further comprising:

means for providing the first, second and third indications external to the MML integrated circuit, in response to the means for serially comparing.

11. An MML integrated circuit according to claim 9 wherein the means for serially comparing comprises:

first means for storing therein the data on the one of the data paths;

means for serially outputting the data on the selected others of the data paths; and means for serially comparing the data on the one of the data paths that is stored in the first means for storing and the serially output data on the selected others of the data paths from the means for serially outputting, and for producing a fourth indication when the compared data is identical and a fifth indication when the compared data is different.

12. An MML integrated circuit according to claim 11 wherein the serially comparing means further comprises:

second means for storing therein a sixth indication if the means for serially comparing ever produces the fifth indication when serially comparing the data on the one of the data paths and the serially output data on the selected others of the data paths, and for storing therein a seventh indication if the means for serially comparing never produces the fifth indication when serially comparing the data on the one of the data paths and the serially output data on the selected others of the data paths.

13. An MML integrated circuit according to claim 12 wherein the means for serially comparing further comprises:

means for producing the first indication if the first means for storing stores data of the first logic value and the second means for storing stores the seventh indication, for producing the second indication if the first storing means stores data of the second logic value and the second storing means stores the seventh indication, and for producing the third indication at the data output pad if the second means for storing stores the sixth indication.

14. An MML integrated circuit according to claim 12 wherein the second storing means includes an input and an output, the MML integrated circuit further comprising:

means for logically combining the fourth indication, the fifth indication and the output.

15. An MML integrated circuit according to claim 13 wherein the means for producing the first indication, the second indication and the third indication is a tri-state buffer and wherein the third indication is a high impedance state.

16. An MML integrated circuit according to claim 9 wherein the first indication is the first logic value, wherein the second indication is the second logic value, and wherein the third indication is a high impedance state.

17. A method of testing a merged memory and logic (MML) integrated circuit including a memory block, a logic block and a plurality of data paths that interconnect the memory block and the logic block, the testing method comprising the following step that is performed in the MML integrated circuit:

serially comparing data on one of the data paths to data on selected others of the data paths, to provide a first indication if the serially compared data on the one of the data paths and on the selected others of the data paths are all a first logic value, to provide a second indication if the serially compared data on the one of the data paths and on the selected others of the data paths are all a second logic value, and to provide a third indication if the serially compared data on the one of the data paths and on the selected others of the data paths are of differing logic values.

18. A method according to claim 17 further comprising the step of providing the first, second and third indications external to the MML integrated circuit.

19. A method according to claim 17 wherein the serial comparing step comprises the steps of:

storing the data on the one of the data paths;

serially outputting the data on the selected others of the data paths; and serially comparing the stored data on the one of the data paths and the serially output data on the selected others of the data paths, to produce a fourth indication when the compared data is identical and a fifth indication when the compared data is different.

20. A method according to claim 19 wherein the serially comparing step further comprises the steps of:

storing a sixth indication if the serially comparing step ever produces the fifth indication when serially comparing the data on the one of the data paths and the serially output data on the selected others of the data paths; and storing a seventh indication if the serially comparing step never produces the fifth indication when serially comparing the data on the one of the data paths and the serially output data on the selected others of the data paths.

21. A method according to claim 20 wherein the serially comparing step further comprises the steps of:

producing the first indication in response to the seventh indication if the data on the one of the data paths is of the first logic value;

producing the second indication in response to the seventh indication if the data on the one of the data paths is of the second logic value; and producing the third indication in response to the sixth indication.

22. A method according to claim 20 further comprising the step of:

logically combining the fourth indication, the fifth indication the sixth indication and the seventh indication.

23. A method according to claim 21 wherein the third indication is a high impedance state.

24. A method according to claim 17 wherein the first indication is the first logic value, wherein the second indication is the second logic value, and wherein the third indication is a high impedance state.

25. A method of testing an integrated circuit including a plurality of data paths, the integrated circuit testing method comprising the following steps that are performed in the integrated circuit:

serially comparing data on one of the data paths to data on selected others of the data paths;

providing a first indication if the serially compared data on the one of the data paths and on the selected others of the data paths are all a first logic value;

providing a second indication if the serially compared data on the one of the data paths and on the selected others of the data paths are all a second logic value; and providing a third indication if the serially compared data on the one of the data paths and on the selected others of the data paths are of differing logic values.

26. A method according to claim 25 further comprising the step of providing the first, second and third indications external to the integrated circuit.

27. A method according to claim 25 wherein the first indication is the first logic value, wherein the second indication is the second logic value, and wherein the third indication is a high impedance state.

* * * * *